(12) United States Patent
Kim et al.

(10) Patent No.: US 12,188,989 B2
(45) Date of Patent: Jan. 7, 2025

(54) METHOD FOR DETECTING ABNORMAL BATTERY CELL

(71) Applicant: Samsung SDI Co., Ltd., Yongin-si (KR)

(72) Inventors: Jake Kim, Yongin-si (KR); Byeonghui Lim, Yongin-si (KR); Yongjun Hwang, Yongin-si (KR); Giheon Kim, Yongin-si (KR); Christober Rayappan, Yongin-si (KR); Sungwook Paek, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 564 days.

(21) Appl. No.: 17/594,497

(22) PCT Filed: Feb. 5, 2020

(86) PCT No.: PCT/KR2020/001667
§ 371 (c)(1),
(2) Date: Oct. 19, 2021

(87) PCT Pub. No.: WO2020/262789
PCT Pub. Date: Dec. 30, 2020

(65) Prior Publication Data
US 2022/0196754 A1    Jun. 23, 2022

(30) Foreign Application Priority Data
Jun. 24, 2019    (KR) .................. 10-2019-0075223

(51) Int. Cl.
*G01R 31/392*    (2019.01)
*G01R 19/165*    (2006.01)
(Continued)

(52) U.S. Cl.
CPC ....... *G01R 31/392* (2019.01); *G01R 31/3842* (2019.01); *G01R 31/389* (2019.01);
(Continued)

(58) Field of Classification Search
CPC ............ G01R 19/16542; G01R 31/382; G01R 31/388; G01R 19/165; G01R 19/16566;
(Continued)

(56) References Cited

U.S. PATENT DOCUMENTS 9,417,290 B1    8/2016    Wang et al.
9,658,291 B1    5/2017    Wang et al.
(Continued)

FOREIGN PATENT DOCUMENTS

CN    107390127 A    11/2017
DE    102014223278 A1    5/2016
(Continued)

OTHER PUBLICATIONS

Kim, Gi-Heon et al: "Efficient and Extensible Quasi-Explicit Modular Nonlinear Multiscale Battery Model: GH-MSMD", Journal of the Electrochemical Society, Sep. 2016, vol. 164, No. 6, pp. A1077-A1088 (13 pages).

(Continued)

*Primary Examiner* — Manish S Shah
*Assistant Examiner* — Christian T Bryant
(74) *Attorney, Agent, or Firm* — Lewis Roca Rothgerber Christie LLP

(57) ABSTRACT

A method for detecting an abnormal battery cell includes periodically generating a voltage value and a current value for each of battery cells, updating, in real time by using an adaptive filter, a G parameter value and an H parameter value of each of battery cells, based on the voltage value and the current value, calculating a representative G parameter value and a representative H parameter value, and deter- (Continued)

mining whether each of the battery cells is an abnormally deteriorated cell based on the G parameter value and the H parameter value of each of the battery cells, the representative G parameter value, and the representative H parameter value. The G parameter indicates sensitivity of voltage with respect to a change in current of the battery cell, and the H parameter indicates an effective potential determined by a local equilibrium potential distribution and a resistance distribution in the battery cell.

14 Claims, 6 Drawing Sheets

(51) Int. Cl.
  *G01R 31/3842* (2019.01)
  *G01R 31/388* (2019.01)
  *G01R 31/389* (2019.01)
  *G01R 31/396* (2019.01)
  *H01M 10/48* (2006.01)
  G01R 31/36 (2020.01)
  H01M 10/42 (2006.01)
  H02J 7/00 (2006.01)

(52) U.S. Cl.
  CPC .......... *G01R 31/396* (2019.01); *G01R 19/165* (2013.01); *G01R 19/16542* (2013.01); *G01R 19/16566* (2013.01); *G01R 31/3648* (2013.01); *G01R 31/388* (2019.01); *H01M 2010/4271* (2013.01); *H01M 10/48* (2013.01); *H02J 7/0013* (2013.01); *H02J 7/005* (2020.01); *H02J 7/007182* (2020.01); *H02J 7/007194* (2020.01)

(58) Field of Classification Search
  CPC .............. G01R 31/392; G01R 31/3842; G01R 31/389; G01R 31/396; G01R 31/3648; H01M 2010/4271; H01M 10/48; H02J 7/005; H02J 7/0048; H02J 7/0013; H02J 7/007182; H02J 7/007194
  See application file for complete search history.

(56) References Cited

U.S. PATENT DOCUMENTS

| 11,693,060 | B2 | 7/2023 | Monden et al. |
| 2007/0299620 | A1* | 12/2007 | Yun ................... G01R 31/3842 702/63 |
| 2009/0064764 | A1 | 3/2009 | Kizaki et al. |
| 2013/0110429 | A1 | 5/2013 | Mitsuyama et al. |
| 2015/0256004 | A1 | 9/2015 | Miller et al. |
| 2016/0187432 | A1* | 6/2016 | Saint-Marcoux ..... B60L 3/0046 702/63 |
| 2016/0336765 | A1 | 11/2016 | Trimboli et al. |
| 2018/0111599 | A1 | 4/2018 | Wang et al. |
| 2019/0064276 | A1* | 2/2019 | Kawai ................. G01R 31/367 |
| 2019/0081369 | A1 | 3/2019 | Monden et al. |
| 2019/0197945 | A1 | 6/2019 | Kim |
| 2020/0088800 | A1* | 3/2020 | Hess .................... G01R 31/389 |
| 2021/0048480 | A1 | 2/2021 | Lim et al. |

FOREIGN PATENT DOCUMENTS

| JP | H 07-41479 U | 7/1995 |
| KR | 10-2016-0081249 A | 7/2016 |
| KR | 10-1835375 B1 | 3/2018 |
| KR | 10-1835376 B1 | 3/2018 |
| KR | 10-2018-0122378 A | 11/2018 |
| KR | 10-2019-0075223 A | 7/2019 |
| KR | 10-2019-0075224 A | 7/2019 |
| KR | 10-2019-0123172 A | 10/2019 |

OTHER PUBLICATIONS

International Search Report for corresponding International Application No. PCT/KR2020/001667, dated May 27, 2020. 4pp.
Notice of Allowance for CN Patent Application No. 202080032978.X dated Jan. 23, 2024, with translation, 9 pages.

* cited by examiner

METHOD FOR DETECTING ABNORMAL BATTERY CELL

CROSS-REFERENCE TO RELATED APPLICATION(S)

This application is a National Phase Patent Application of International Patent Application Number PCT/KR2020/001667, filed on Feb. 5, 2020, which claims priority of Korean Patent Application No. 10-2019-0075223, filed Jun. 24, 2019. The entire contents of both of which are incorporated herein by reference.

TECHNICAL FIELD

One or more embodiments relate to a method for accurately detecting an abnormal battery cell.

BACKGROUND ART

Compared to other energy storage devices, batteries are easy to be applied, and also, due to their characteristics, such as relatively high energy and power density, batteries are widely used not only in portable devices but also electric vehicles (EVs) or hybrid electric vehicles (HEVs) driven by an electric driving source. In particular, when a strong output is required, a battery pack in which a plurality of battery cells are connected in series and in parallel, may be used.

Battery management is important in the case of an electric device driven by a battery or battery pack in an energy-efficient and safe manner, and to this end, accurate estimation and diagnosis of battery conditions is essential. In particular, as the use progresses, the battery cell deteriorates. In this case, the internal state of the battery cell changes. In this case, the battery cell deteriorates abnormally. Detecting this abnormality is very significant for the stable use of the battery.

In the related art, after the correlation between measurable variables (current I, voltage V, temperature T) and the internal state to be estimated is found experimentally in advance, the correlation is created in a table form and used to estimate the internal state of the battery such as the resistance, capacitance, and open circuit voltage (OCV). Because the internal state is affected by various variables, for the accurate estimation of the internal state, various combination for the state of charge (SOC), current I, voltage V, and temperature T of the battery need to be configured to collect data. Thus, the higher the accuracy, the more data is required. Thus, time and costs also increase. In addition, in the methods according to the related art, there are problems in that it is required to stop using the battery, a specific condition or environment needs to be adjusted, or sensor errors or estimation errors are accumulated so that the accuracy is not reliable.

DESCRIPTION OF EMBODIMENTS

Technical Problem

One or more embodiments include a method that overcomes the disadvantages of the methods according to the related art so that the existence or absence of abnormalities in each of battery cells is accurately estimated in real time by using a voltage and current values measured for the voltage and current of the battery cells in use. One or more embodiments include a method capable of accurately detecting an abnormal battery cell among battery by using a G parameter and an H parameter indicating an internal state of the battery cells. One or more embodiments include an algorithm for detecting abnormal battery cells that may be mounted in a battery management system (BMS).

Solution to Problem

According to one or more embodiments, a method for detecting an abnormal battery cell includes detecting a voltage and a current of each of a plurality of battery cells electrically connected between first and second terminals and being in use so as to periodically generate a voltage value and a current value of each of the plurality of battery cells, updating a G parameter value and an H parameter value, which are numerical values of each of a G parameter and an H parameter indicating a current state of each of the plurality of battery cells, from a voltage value and a current value of each of the battery cells in real time by using an adaptive filter, calculating a representative G parameter value and a representative H parameter value each representing a G parameter value and an H parameter value of the battery cells, and determining whether each of the battery cells is an abnormally deteriorated cell based on the G parameter value, the H parameter value, the representative G parameter value, and the representative H parameter value of each of the battery cells. The G parameter is a parameter indicating sensitivity of voltage with respect to a change in current of the battery cell, and the H parameter is a parameter indicating an effective potential determined by local equilibrium potential distribution and resistance distribution in the battery cell.

Advantageous Effects of Disclosure

A method for detecting an abnormal battery cell according to various embodiments has been greatly enhanced compared to methods according to the related art in terms of cost, scalability, and adaptability. In particular, because the method for detecting an abnormal battery cell is not an estimation method based on an estimate like the existing experimental model but estimates the internal state of the battery using values that may be directly measured, the method is superior to methods according to the related art in terms of accuracy. In addition, the method for detecting an abnormal battery cell may be mounted in a battery management system (BMS) in a form of an algorithm.

BEST MODE

The merits and features of the present disclosure, and a method of achieve them will become apparent with reference to the embodiments described in detail in conjunction with the accompanying drawings. However, it should be understood that the present disclosure is not limited to the embodiments present below but may be implemented in various different forms and includes all transformations, equivalents and substitutes included in the spirit and scope of the present disclosure. The embodiments presented below are provided to complete the disclosure of the invention and are provided to fully inform those of ordinary skill in the art to which the present disclosure pertains to the scope of the invention. In the description of the present disclosure, certain detailed explanations of related art are omitted when it is deemed that they may unnecessarily obscure the essence of the invention.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. While such terms "first," "second," etc., may be used to describe various components, such components must not be limited to the above terms. The above terms are used only to distinguish one component from another.

Hereinafter, embodiments of the present disclosure will be described below in more detail with reference to the accompanying drawings. Those components that are the same or are in correspondence are rendered the same reference number regardless of the figure number, and redundant explanations are omitted.

Figure 1:
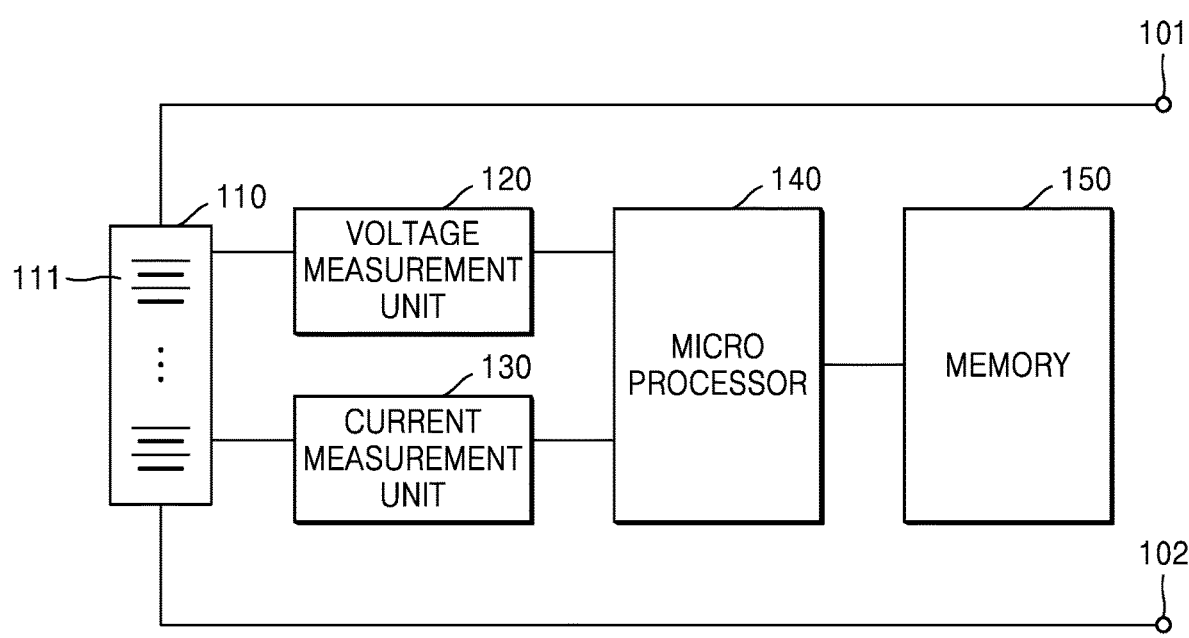
FIG. 1 is a schematic configuration diagram of a battery system for performing a method for detecting an abnormal battery cell according to an embodiment.

FIG. 1 is a schematic configuration diagram of a battery system for performing a method for detecting an abnormal battery cell according to an embodiment.

Referring to FIG. 1, a battery system 100 may include a battery 110, a voltage measurement unit 120, a current measurement unit 130, a microprocessor 140, and a storage unit 150.

The battery 110 that is a unit for storing power, may include a plurality of battery cells 111 electrically connected to each other between a first terminal 101 and a second terminal 102. The plurality of battery cells 111 may be connected in series, in parallel, or in a combination of series and parallel. Each of the battery cells 111 may ideally discharge and charge a current of the same size, and may have a capacity of the same size. However, in reality, the internal states of the battery cells 111 may be different, and as a result, they may have different internal resistances and electromotive force. Also, each of the battery cells 111 may have different G parameter values and H parameter values.

Each battery cell 111 may include a chargeable secondary battery. For example, the battery cell 111 may include a nickel-cadmium battery, a lead acid battery, a nickel metal hydride (NiMH) battery, a lithium ion battery, or a lithium polymer battery. The number of battery cells 111 may be determined according to capacitance, output voltage, and output current required for the battery 1110.

One battery 110 is illustrated in FIG. 1. However, a plurality of batteries 110 may be connected in parallel and/or in series and may be connected to a load and/or charging device through the first and second terminals 101 and 102. Although not shown in FIG. 1, the battery 110 is connected to the load and/or charging device and is in use. That is, the battery 110 may be discharging current to the load or charging power from the charging device.

The voltage measurement unit 120 may be connected to both ends of each of the battery cells 111 in use and may measure voltage of each of the battery cells 111 and may periodically generate a voltage value of each of the battery cells 111. Because, when the battery cells 111 are connected in parallel, the battery cells 111 connected in parallel have the same voltages, the voltage measurement unit 120 may measure voltage of one battery cell 111 and may generate the same voltage values of the remaining battery cells 111.

For example, the voltage measurement unit 120 may measure voltage at both terminals of each of the battery cells 111 in a pre-set time period $\Delta t$. The current or recently measured voltage value is referred to as a current voltage value and is denoted by V(t). The voltage value measured before the time period $\Delta t$ is referred to an immediately preceding voltage value and is denoted by V(t−1). The time period $\Delta t$ may be, for example, 1 second. However, this is exemplary, and the time period $\Delta t$ may be set to another time, for example, 0.1 second, 0.5 second, 2 seconds, 5 seconds, 10 seconds, or the like. The time period $\Delta t$ may be properly set according to an electric system connected to the battery system 100.

Voltage values of each of the battery cells 111 may be different from each other according to the internal state of the battery cells 111. A current voltage value and an immediately preceding voltage value of a j-th battery cell 111 are denoted by $V\_j(t)$ and $V\_j(t-1)$, respectively. Here, j means the number of the battery cells 111, may be greater than or equal to 1 and may be less than or equal to the total number of battery cells 111 included in the battery 110.

The current measurement unit 130 may measure current of each of the battery cells 111 in use and may periodically generate a current value of each of the battery cells 111. Because, when the battery cells 111 are connected in series, the battery cells 111 connected in series have the same currents, the current measurement unit 130 may measure the current of one battery cell 111 and may generate the same current values of the remaining battery cells 111.

The voltage measurement unit 120 and the current measurement unit 130 may be synchronized with each other and may measure voltage and current of each of the battery cells 111 at the same time. The current measurement unit 130 may measure the current of each of the battery cells 111 at the time period $\Delta t$. The value of current measured by the current measurement unit 130 may be displayed as positive (+) when the current is the charging current and negative (−) when the current is the discharging current. The current or recently measured current value is referred to as a current current value and is denoted by I(t), and a current value measured before the time period $\Delta t$ is referred to as an immediately preceding current value and is denoted by I(t−1).

The current values of each of the battery cells 111 may be different from each other according to the internal state of the battery cells 111. The current current value and the immediately preceding value of the j-th battery cell 111 are denoted by $I\_j(t)$ and $I\_j(t-1)$, respectively.

The microprocessor 140 may update a G parameter value and an H parameter value, which are numerical values of each of a G parameter and an H parameter indicating the current state of each of the battery cells 111, from the voltage value of each of the battery cells 111 provided by the voltage measurement unit 120 and the current value of each of the battery cells 111 provided by the current measurement unit

130 in real time. Here, the G parameter is a parameter indicating the sensitivity of voltage with respect to a change in the current of the battery cells 111 is use, and the H parameter is a parameter indicating an effective potential determined by the local equilibrium potential distribution and resistance distribution in the battery cells 110 in use. The G parameter and the H parameter of the j-th battery cell 111 are denoted by $G\_j$ and $H\_j$, respectively. The G parameter value and the H parameter value of the j-th battery cell 111 are denoted by $G\_j(t)$ and $H\_j(t)$.

The microprocessor 140 may use an adaptive filter so as to generate the G parameter value and the H parameter value of each of the battery cells from the voltage value and the current value of each of the battery cells 111. The adaptive filter may be a filter using recursive least squares (RLS) or filter using weighted least squares (WLS). Hereinafter, an embodiment in which the microprocessor 140 uses an adaptive filter using RLS, will be described in detail.

The microprocessor 140 may determine an abnormally deteriorated cell or an abnormally reduced capacity cell among the battery cells 111 by using a G parameter value and an H parameter value of each of the battery cells 111 generated in real time. The G parameter value and the H parameter value of each of the battery cells 111 may be generated in real time from the voltage value and the current value of each of the battery cells 111 by using the adaptive filter. The abnormally deteriorated cell and the abnormally reduced capacity cell may be referred to as an abnormal battery cell.

According to an embodiment, the microprocessor 140 may calculate a representative G parameter value from the G parameter value of each of the battery cells 111. The representative G parameter value may be an average value or a median value of G parameter values. The representative G parameter value may be determined as a different value that may represent G parameters.

The microprocessor 140 may calculate a representative H parameter value from the H parameter value of each of the battery cells 111. The representative H parameter value may be an average value or a median value of H parameter values. The representative H parameter value may be determined as a different value that may represent H parameters.

The microprocessor 140 may determine whether each of the battery cells 111 is an abnormally deteriorated cell or an abnormally reduced capacity cell by using the G parameter value of each of the battery cells 111, the H parameter value of each of the battery cells 111, the representative G parameter value, and the representative H parameter value.

According to an embodiment, the microprocessor 140 may be included in the battery management system (BMS) of the battery pack because the microprocessor 140 uses only a simple operation on the order of four arithmetic operations to detect an abnormal battery cell. According to another embodiment, a method for detecting an abnormal battery cell according to the present disclosure may be performed by a microcontroller or an electronic control unit (ECU) in the BMS of an electric vehicle. According to another embodiment, the method for detecting an abnormal battery cell according to the present disclosure may be performed by an integrated controller of an energy storage system. According to another embodiment, the method for detecting an abnormal battery cell may be performed by a processor of a server connected to the battery system or the energy storage system by communication.

The storage unit 150 may store commands and data required for performing the method for detecting an abnormal battery cell according to the present embodiment. Because, in the method according to the present embodiment, the G parameter value and the H parameter value of each of the battery cells 111 may be generated based on the voltage value and the current value of each of the battery cells 111 generated at the time period $\Delta t$ and an abnormal battery cell is detected based on the G parameter value and the H parameter value of each of the battery cells 111, the current voltage value, the current current value, and the immediately preceding value of each of the battery cells 111 may be stored in the storage unit 150, and other voltage and current data may not be stored in the storage unit 150. That is, a large amount of voltage and current data do not need to be stored in the storage unit 150.

According to the method for detecting an abnormal battery cell according to the present embodiment, the storage unit 150 may store the immediately preceding value and current value of a state vector including the G parameter and the H parameter of each of the battery cells 111, and the immediately preceding value and the current value of a covariance matrix required for the RLS method. Also, the storage unit 150 may store the representative G parameter value and the representative H parameter value. Thus, because a large amount of commands and data do not need to be stored in the storage unit 150, the storage unit 150 may be implemented as a memory having a small size. For example, the storage unit 150 may be implemented as a memory within the microprocessor 140.

Significant estimation values representing the current state of the battery include a state of charge (SOC), a state of health (SOH), and a state of power capability (SOP). In a method for estimating the internal state of a battery according to the related art, the correlation between measurable variables (current I, voltage V, and temperature T) and the internal state to be estimated is experimentally found in advance, and then is made in the form of a table, and the internal state of the battery, such as the internal resistance, internal capacitance, and open circuit voltage (OCV) of the battery cell is estimated using the correlation made in the form of the table. These methods for estimating the battery state have weaknesses in cost, scalability, and adaptability.

According to the method for estimating the internal state of the battery according to the related art, data need to be collected in advance through experiments, and the internal states of the battery are estimated based on the collected data. Because the internal states are affected by various variables, for exact estimation of the internal states, data need to be collected by configuring various combinations of the state of charge (SOC) of the battery, the current I, the voltage V, and the temperature T of the battery. Thus, the higher the accuracy is pursed, the more data is required, and accordingly, the time and financial costs also rise. In addition, the internal states need to be estimated by extrapolation on values that exceed the range of variables measured by experiments. In this case, the reliability of the estimate may be a problem. In addition, when the internal states estimated through experiments are not accurate, the utility of the estimated internal states is lowered. A method of experimentally finding the correlation in advance and using the correlation for estimating a state variable also has a similar problem.

In order to extract the state information of a battery pack, experimental data on the battery pack is required. However, because high cost is required for collecting data about the battery pack, data measured from the battery cell is generally used instead to estimate the state information of the battery pack. However, this method is based on the assumption that the relationship between variables measured from the battery cell is a scalable mechanism to a larger system. Thus, if the scalability of a mechanism between systems is not verified in advance through additional verification, the reliability of the state information of the battery pack estimated by this method may be questioned, and there may be problems with the accuracy.

Adaptability of internal state estimation according to the related art is lowered. Batteries have different characteristics over time. This is called the aging effect. The correlation between measurable variables such as voltage V, current I, and temperature T of the battery and the internal state also changes with time. However, it is difficult to reflect the aging effect if a table indicating the correlation between measurable variables and the internal state to be estimated is completed in advance through experimentation. In order to reflect the aging effect, various experiments on the aging effect need to be performed in advance, or the aging effect needs to be predicted to be reflected in an experimental model in advance. However, the former has a problem of cost increase, and the later has a risk of reducing the reliability of the state estimate if the aging effect is not accurately predicted in advance. Changes in the design of battery cells as well as the time may also cause changes in battery cell characteristics. However, if these changes are not predicted in advance and are not reflected on the experimental model, when there is a design change such as an active material or shape used in the manufacture of the battery cell, the existing experimental model cannot be used.

In addition to the experimental model, the battery internal state may also be estimated using an electrochemical model (e.g., Newman's model) considering electrochemical phenomena and thermal behavior in the battery. By using this model, physical states that cannot be directly measured can be used as control parameters of the battery management system. However, such a model has disadvantage that it requires excessive time and cost to develop, and the resources required for calculation are too large. Thus, it is not widely used in battery management systems.

In order to overcome the problem of methods according to the related art, the present disclosure proposes a method of distinguishing a normal battery cell from an abnormal battery cell by using a G parameter and an H parameter, which are parameters indicting the current state of the battery cell. The method for detecting an abnormal battery cell according to the present disclosure may be relatively simply implemented to be performed in a battery management system (BMS), and may have high accuracy without additional driving conditions.

The G parameter is a state quantity indicating the sensitivity of a terminal voltage of a battery cell to a change in current applied to the battery cell in use, and has a unit of resistance. The H parameter is the effective potential determined by the local equilibrium potential distribution and resistance distribution within the battery cell during use. The G parameter and the H parameter of the battery cell may be quantified as an explicit correlation between the battery material properties and design variables using a theoretical model. Hereinafter, the G parameter and the H parameter of the battery cell will be described.

In the battery cell, it can be assumed that the voltage V and the current i have the same relationship as $V=f(i; x, p)$. Here, x is a physical quantity indicating the internal state of the battery cell, and p is a parameter.

The function f is a nonlinear implicit function. When the function f can be divided into a rapidly changing quantity g and a slowly changing quantity h, the above relation is $V=g(i; x, p)+h(i; x, p)$.

If it is assumed that there is a function $G(i; x, p)=dg/di$ that changes slowly with respect to current i, the above relation can be expressed as $V=G(i; x, p)i+H(i; x, p)$.

In the above relation, dG/di and dH/di have very small values. In other words, when the above-described assumptions are satisfied, G and H are the functions that change slowly with respect to the current i. Thus, the function f indicating the nonlinear relationship between the voltage V and the current i can be expressed as a quasi-linear relationship, like the above relation.

Here, G is referred to as a G parameter, and H is referred to as an H parameter. When the current i is a charge/discharge current and Ueq is the equilibrium potential of the battery cell, the discharge overvoltage may be calculated using the G parameter G and the H parameter as $Ueq-V=-G\cdot i+(Ueq-H)$.

Here, $-G\circ i$ is an overvoltage generated by the battery cell to flow a current through the terminal, and includes a reaction dynamic polarization amount and an electron and ionic resistance polarization amount. (Ueq−H) is the overvoltage caused by the deviation of the local thermodynamic equilibrium state of the battery cell from the equilibrium state of the whole system. That is, (Ueq−H) is the inefficiency caused by the thermodynamic non-uniformity inside the battery cell. When the internal system of the battery cell reaches a thermodynamic equilibrium state, the H parameter H becomes equal to the equilibrium potential Ueq.

In the method for detecting an abnormal battery cell according to embodiments, a G parameter and an H parameter of each of the battery cells are directly extracted from a voltage value and a current value measured from each of the battery cells by using an RLS method, for example, and an abnormal battery cell is detected using the G parameter G and the H parameter H of each of the battery cells.

Figure 2:
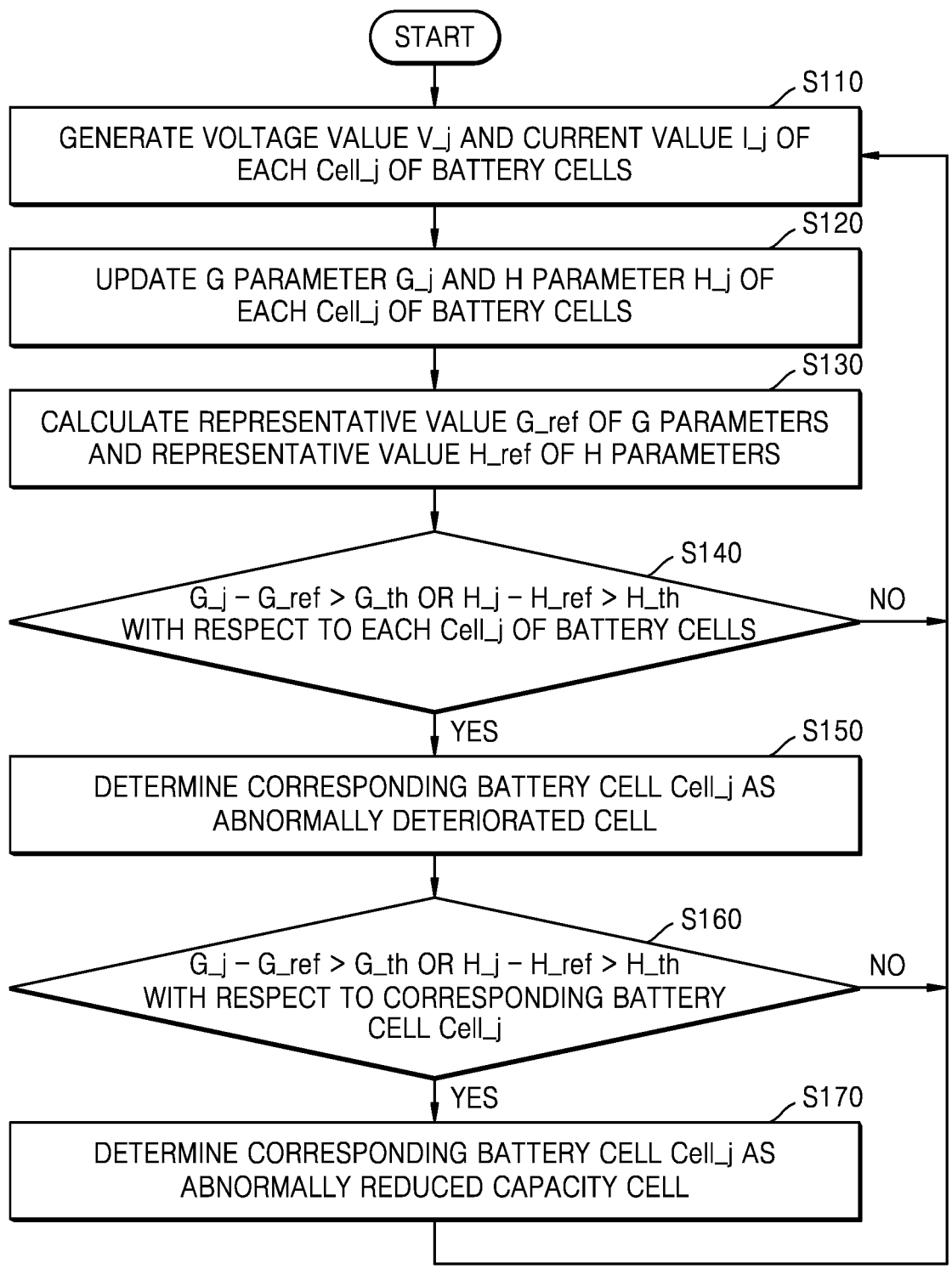
FIG. 2 is a flowchart illustrating a method for detecting an abnormal battery cell according to an embodiment.

FIG. 2 is a flowchart illustrating a method for detecting an abnormal battery cell according to an embodiment.

Referring FIG. 2 together with FIG. 1, the microprocessor 140 may perform the method for detecting an abnormal battery cell shown in FIG. 2 by using an adaptive filter.

The microprocessor 140 may detect the voltage and the current of each of the plurality of battery cells 111 that are electrically connected between the first and second terminals 101 and 102 and in use, by using the voltage measurement unit 120 and the current measurement unit 130. The microprocessor 140 may periodically generate the voltage value V and the current value I of each of the battery cells 111 (S110). The voltage value V_j and the current value I_j of a j-th battery cell (e.g., Cell_j) may be generated. The j-th battery cell (e.g., Cell_j) may refer to one among the battery cells 111 included in the battery 110.

The microprocessor 140 may update a G parameter value G_j(t) and an H parameter value H_j(t), which are numerical values of each of the G parameter and the H parameter indicating the current state of each (e.g., Cell_j) of the battery cells, from the voltage value V_j and the current value I_j of each (e.g., Cell_j) of the battery cells in real time by using the adaptive filter stored in the memory 150 (S120). An operation of updating the G parameter value G_j(t) and the H parameter value H_j(t) in real time (S120) will be described below in detail.

The microprocessor 140 may calculate a representative G parameter value G_ref representing the G parameter value G(t) of the battery cells 111 and may calculate a representative H parameter value H_ref representing the H parameter value H(t) of the battery cells 111. According to an embodiment, the representative G parameter value G_ref may be an average value of G parameter values G(t), and the representative H parameter value H_ref may be an average value of H parameter values H(t). According to another embodiment, the representative G parameter value G_ref may be a median value of the G parameter values G(t), and the representative H parameter value H_ref may be a median value of the H parameter values H(t).

The microprocessor 140 may determine whether each (e.g., Cell_j) of the battery cells is an abnormally deteriorated cell, based on the G parameter value G_j(t), the H parameter value H_j(t), the representative G parameter value G_ref, and the representative H parameter value H_ref. For example, the microprocessor 140 may calculate a G parameter deviation value G_j(t)–G_ref of each battery cell (e.g., Cell_j) by subtracting a representative G parameter value G_ref from a G parameter value G_j(t) of each battery cell (e.g., Cell_j) with respect to each (e.g., Cell_j) of the battery cells, may calculate an H parameter deviation value H_j(t)–H_ref of each battery cell (e.g., Cell_j) by subtracting a representative H parameter value H_ref from an H parameter value H_j(t) of each battery cell (e.g., Cell_j) with respect to each (e.g., Cell_j) of the battery cells, and may determine whether a G parameter deviation value G_j(t)–G_ref of each battery cell (e.g., Cell_j) is greater than a preset G parameter set value (G_th) or an H parameter deviation value H_j(t)–H_ref of each battery cell (e.g., Cell_j) is greater than a preset H parameter set value H_th (S140).

When the G parameter deviation value G_j(t)_G_ref of each battery cell (e.g., Cell_j) is greater than the preset G parameter set value G_th or the H parameter deviation value H_j(t)–H_ref of each battery cell (e.g., Cell_j) is greater than the preset H parameter set value H_th, the microprocessor 140 may determine a corresponding battery cell (e.g., Cell_j) as an abnormally deteriorated cell (S150). For example, the G parameter set value G_th may be preset to about 0.5, and the H parameter set value H_th may be preset to about 0.01. However, these values are exemplary, and the G parameter set value G_th and the H parameter set value H_th may be set to different values according to characteristics of the battery cells 111.

If the G parameter deviation value G_j(t)–G_ref of each battery cell (e.g., Cell_j) is not greater the preset G parameter set value G_th and the H parameter deviation value H_j(t)–H_ref of each battery cell (e.g., Cell_j) is not greater than the preset H parameter set value H_th, the microprocessor 140 may determine whether the battery cell Cell_k is an abnormally deteriorated cell, by performing determination of Operation S140 on the battery cell (e.g., Cell_k).

If the G parameter deviation value G(t)–G_ref of all battery cells 111 is not greater than the preset G parameter set value G_th and the H parameter deviation value H(t)–H_ref of all battery cells 111 is not greater than the present H parameter set value H_th, the microprocessor 140 may proceed to Operation S110 to newly generate a voltage value and a current value of each of the battery cells 111 after a preset time period Δt.

When the microprocessor 140 determines a battery cell (e.g., Cell_j) as an abnormally deteriorated cell in Operation S150, the microprocessor 140 may determine whether the G parameter deviation value G_j(t)–G_ref of the battery cell (e.g., Cell_j) is greater than the preset G parameter set value G_th and the H parameter deviation value H_j(t)–H_ref of the battery cell (e.g., Cell_j) is greater than the preset H parameter set value H_th (S160).

When the G parameter deviation value G_j(t)–G_ref of the battery cell (e.g., Cell_j) is greater than the preset G parameter set value G_th and the H parameter deviation value H_j(t)–H_ref of the battery cell (e.g., Cell_j) is greater than the preset H parameter set value H_th, the microprocessor 140 may determine that the corresponding battery cell Cell_j is an abnormally reduced capacity cell (S170).

When it is determined in Operation S160 that the G parameter deviation value G_j(t)–G_ref of the battery cell (e.g., Cell_j) is not greater than the preset G parameter set value G_th or the H parameter deviation value H_j(t)–H_ref of the battery cell (e.g., Cell_j) is not greater than the preset H parameter set value H_th and when, in Operation S170, the battery cell Cell_j is determined as an abnormally reduced capacity cell, the microprocessor 140 may proceed to Operation S110 to newly generate a voltage value and a current value of each of the battery cells 111 after the preset time period Δt.

According to an embodiment, the microprocessor 140 may perform Operations of FIG. 2 by using a filter using an RLS method stored in the memory 150.

Figure 3:
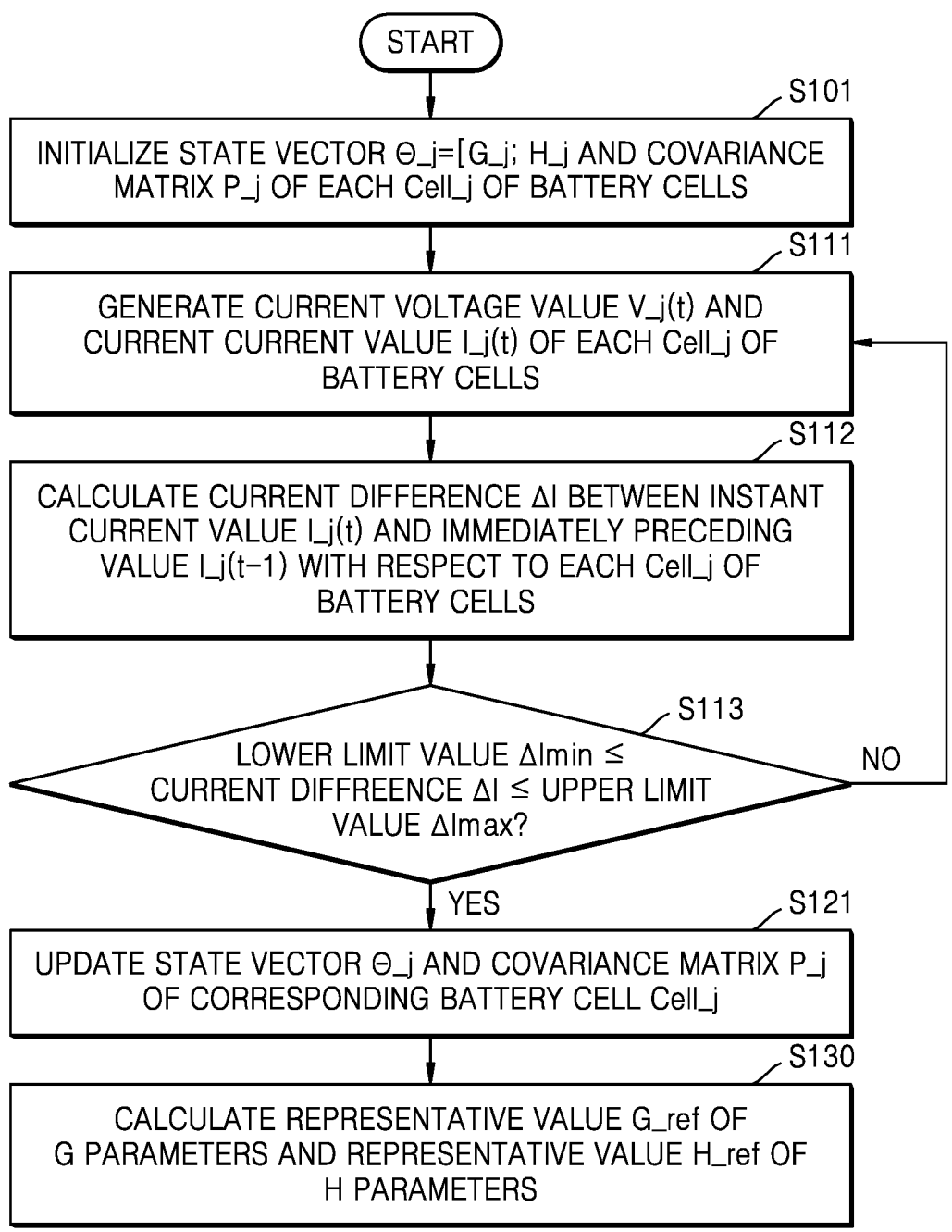
FIG. 3 is a flowchart illustrating some detailed operations of the method for detecting an abnormal battery cell of FIG. 2.

FIG. 3 is a flowchart illustrating Operations S110 to S120 of the method for detecting an abnormal battery cell of FIG. 2.

Referring to FIGS. 1 through 3, when the microprocessor 140 uses an RLS filter, the microprocessor 140 may initialize the state vector Θ=[G; H] and the covariance matrix P of each of the battery cells 111 (S101). For example, there may be a state vector Θ_j=[G_j; H_j] and a covariance matrix P_j corresponding to a j-th battery cell Cell_j, and in Operation S101, the microprocessor 140 may initialize the state vector Θ_j=[G_j; H_j] and the covariance matrix P_j of the j-th battery cell (e.g., Cell_j).

Operation S110 of FIG. 2 may include Operations S111, S112, and S113 of FIG. 3. In Operation S111, the microprocessor 140 may generate a current voltage value V(t) and a current current value I(t) of each of the battery cells 111. The current voltage value V(t) and the current current value I(t) of each of the battery cells 111 generated before the time period Δt may be an immediately preceding voltage value V(t−1) and an immediately preceding current value I(t−1) of each of the battery cells 111. For example, the microprocessor 140 may generate an immediately preceding voltage value V_j(t−1) and an immediately preceding current value I_(t−1) of the j-th battery cell (e.g., Cell_j) and may generate a current voltage value V_j(t) and a current current value I_j(t) of the j-th battery cell (e.g., Cell_j) after the time period Δt.

In Operation S112, the microprocessor 140 may calculate a current difference ΔI between the current current value I(t) and the immediately preceding value I(t−1) with respect to each of the battery cells 111. For example, a current difference ΔI_j between a current current value I_j(t) and an immediately preceding value I_(t−1) with respect to the j-th battery cell (e.g., Cell_j).

In Operation S113, the microprocessor 140 may compare a current difference ΔI of each of the battery cells 111 with a preset range. The preset range may be defined by using a lower limit value ΔImin and an upper limit value ΔImax. For example, the microprocessor 140 may determine whether the current difference ΔI_j of the j-th battery cell (e.g., Cell_j) is between the lower limit value ΔImin and the upper limit value ΔImax.

When the current difference ΔI_j of the j-th battery cell (e.g., Cell_j) is between the lower limit value ΔImin and the upper limit value ΔImax, in Operation S121, a state vector Θ_j and a covariance matrix P_j of the j-th battery cell (e.g., Cell_j) may be updated. Because the state vector Θ_j of the j-th battery cell (e.g., Cell_j) includes a G parameter value G_j(t) and an H parameter value H_j(t) of the j-th battery cell (e.g., Cell_j), when, in Operation S121, the state vector Θ_j is updated, the G parameter value G_j(t) and the H parameter value H_j(t) may be updated (S120).

Subsequently, the microprocessor 140 may perform Operation S130 of FIG. 2.

According to the present embodiment, a state vector $\hat{\Theta}(t)$ and a covariance matrix P(t) may be used. Hereinafter, a method of updating the G parameter value G_j(t) and the H parameter value H_j(t) of one battery cell (e.g., Cell_j) among the battery cells 111 in real time will be described. Because the G parameter value G_k(t) and the H parameter value H_k(t) are calculated in the same manner for other battery cells (e.g., Cell_j), a number (e.g., j or k) to identify the batter cells 111, respectively, is omitted.

The state vector $\hat{\Theta}(t)$ may include a G parameter $\hat{G}(t)$ and an H parameter $\hat{H}(t)$ and may be defined as $$\hat{\Theta}(t) = \begin{bmatrix} \hat{G}(t) \\ \hat{H}(t) \end{bmatrix}.$$

The covariance matrix P(t) may include a first value $P_1(t)$ and a second value $P_2(t)$ and may be defined as $$P(t) = \begin{bmatrix} P_1(t) \\ P_2(t) \end{bmatrix}.$$

A voltage value V(t) and a current value I(t) of the battery cell 111 may be generated for each time period Δt, and the state vector $\hat{\Theta}(t)$ and the covariance matrix P(t) may be updated for each time period Δt by using a recursive method. The G parameter $\hat{G}(t)$ and the H parameter $\hat{H}(t)$ may also be updated for each time period Δt.

The microprocessor 140 may initialize the state vector $\hat{\Theta}(t)$ and the covariance matrix P(t) in Operation S101. For example, the state vector $\hat{\Theta}(t)$ may be initialized as $$\hat{\Theta}(0) = \begin{bmatrix} \hat{G}(0) \\ \hat{H}(0) \end{bmatrix} = \begin{bmatrix} 1 \\ 1 \end{bmatrix},$$

and the covariance matrix P(t) may be initialized as $$P(0) = \begin{bmatrix} P_1(0) \\ P_1(0) \end{bmatrix} = \begin{bmatrix} 1 \\ 1 \end{bmatrix}.$$

In the present embodiment, elements of the state vector $\hat{\Theta}(t)$ and elements of the covariance matrix P(t) are all initialized to 1, but this is exemplary and may be initialized to other values.

The microprocessor 140 may measure the voltage and the current of each of the battery cells 111 by using the voltage measurement unit 120 and the current measurement unit 130 and may periodically generate a voltage value and a current value of each of the battery cells 111 for each time period Δt, for example (S120). The microprocessor 140 may generate an immediately preceding voltage value V(t−1) and an immediately preceding current value I(t−1) of each of the battery cells 111 and may generate a current voltage value V(t) and a current current value I(t) of each of the battery cells 111 after the time period Δt.

The microprocessor 140 may update the G parameter $\hat{G}(t)$ and the H parameter $\hat{H}(t)$ for each time period Δt by using the current voltage value V(t) and the current current value I(t) generated for each time period Δt by using an RLS method.

The microprocessor 140 may calculate a current voltage estimate $\hat{V}(t)$ of the battery cell 111 based on the current current value I(t) and an immediately preceding value $\hat{\Theta}(t-1)$ of the state vector. The immediately preceding value $\hat{\Theta}(t-1)$ of the state vector may be calculated based on the immediately preceding voltage value V(t−1) and the immediately preceding current value I(t−1) before the time period Δt and may include an immediately preceding value $\hat{G}(t-1)$ of the G parameter and an immediately preceding value $\hat{H}(t-1)$ of the H parameter. The current voltage estimate $\hat{V}(t)$ of the battery cell 111 that is a value obtained by adding the immediately preceding value $\hat{H}(t-1)$ of the H parameter to a product of the current current value I(t) and the immediately preceding value at $\hat{G}(t-1)$ of the G parameter, may be calculated as $\hat{V}(t)=I(t)\hat{G}(t-1)+\hat{H}(t-1)$.

The microprocessor 140 may update a gain matrix L(t) based on the current current value I(t) and the immediately preceding value P(t−1) of the covariance matrix. The immediately preceding value P(t−1) of the covariance matrix may be calculated based on the immediately preceding voltage value V(t−1) and the immediately preceding current value I(t−1) before the time period Δt and may include a first immediately preceding value $P_1(t-1)$ of the covariance matrix and an immediately preceding value $P_2(t-1)$ of the covariance matrix according to the definition of the covariance matrix P(t). The gain matrix L(t) correspond to each of the battery cells 111.

The gain matrix L(t) is used to update the state vector $\hat{\Theta}(t)$ and the covariance matrix P(t). The gain matrix L(t) may include a first value $L_1(t)$ of the gain matrix and a second value $L_2(t)$ of the gain matrix and may be calculated as below.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

Here, $\lambda_1$ is a first forgetting factor and is related to the G parameter. $\lambda_2$ is a second forgetting factor and is related to the H parameter. The first forgetting factor $\lambda_1$ and the second forgetting factor $\lambda_2$ are value for indicating the effect of a past voltage value and a past current value on the current value $\hat{G}(t)$ of the G parameter and a current value $\hat{H}(t)$ of the H parameter in the calculation of the G parameter G(t) and the H parameter $\hat{H}(t)$, respectively. The first forgetting factor $\lambda_1$ and the second forgetting factor $\lambda_2$ may have an effect on the current value $\hat{G}(t)$ of the G parameter and the current value $\hat{H}(t)$ of the H parameter for a long period of time as they are closer to 1 and may have an effect on the for a short period of time as they are closer to 0.

According to an embodiment, the first forgetting factor $\lambda_1$ and the second forgetting factor $\lambda_2$ may be 0.9 or more and 1 or less. According to another embodiment, the first forgetting factor $\lambda_1$ may be set to a value that is greater than or equal to the second forgetting factor $\lambda_2$. For example, the first forgetting factor $\lambda_1$ may be set to 0.99999, and the second forgetting factor $\lambda_2$ may be set to 0.95. These set values may change according to characteristics of the battery cell 111.

The inventors of the present disclosure found that high reliability results were obtained when the first forgetting factor $\lambda_1$ and the second forgetting factor $\lambda_2$ were 0.99999 and 0.95, respectively, in an experiment performed on a specific battery cell. However, the above values are exemplary and may also be set to different values according to the characteristics of the battery cell 111. For example, the first forgetting factor $\lambda_1$ may be set to 0.9999, and the second forgetting factor $\lambda_2$ may also be set to 0.98.

According to another embodiment, all of the first forgetting factor $\lambda_1$ and the second forgetting factor $\lambda_2$ may also be set to 1. In this case, it can be seen that the first forgetting factor $\lambda_1$ and the second forgetting factor $\lambda_2$ are not applied.

The microprocessor 140 may update the covariance matrix P(t) based on the current current value I(t), the gain matrix L(t), and the immediately preceding value P(t−1) of the covariance matrix. The covariance matrix P(t) may be calculated as below.

$$P(t) = \begin{bmatrix} P_1(t) \\ P_2(t) \end{bmatrix} = \begin{bmatrix} \{1 - L_1(t)\}I(t)P_1(t-1)/\lambda_1 \\ \{1 - L_2(t)\}P_2(t-1)/\lambda_2 \end{bmatrix}$$

The microprocessor 140 may calculate a voltage error e(t) between the current voltage value V(t) and the current voltage estimate $\hat{V}(t)$ calculated above, as e(t)=V(t)−$\hat{V}$(t).

The microprocessor 140 may update the state vector $\hat{\Theta}$(t) based on the immediately preceding value $\hat{\Theta}$(t−1) of the state vector, the current value L(t) of the gain matrix, and the voltage error e(t). The state vector $\hat{\Theta}$(t) may be updated so that the current value $\hat{G}$(t) of the G parameter and the current value $\hat{H}$(t) of the H parameter may be generated.

The current value $\hat{\Theta}$(t) of the state vector may be calculated as below, to a value obtained by adding a product of the current value L(t) of the gain matrix and the voltage error e(t) to the immediately preceding value $\hat{\Theta}$(t−1) of the state vector.

$$\hat{\Theta}(t) = \begin{bmatrix} \hat{G}(t) \\ \hat{H}(t) \end{bmatrix} = \hat{\Theta}(t-1) + L(t) \times e(t)$$

The above equation for recursively expressing the state vector $\hat{\Theta}$(t) may be derived as below.

First, a loss-function ε to which the first forgetting factor $\lambda_1$ and the second forgetting factor $\lambda_2$ are applied, may be defined as below.

$$\varepsilon(\hat{G}(t), \hat{H}(t), t) = \frac{1}{2}\sum_{i=1}^{t} \lambda_1^{t-i}\{V(i) - I(i)\hat{G}(t) - H(i)\}^2 + \frac{1}{2}\sum_{i=1}^{t} \lambda_2^{t-i}\{V(i) - I(i)G(i) - \hat{H}(t)\}^2$$

Here, V(i) is an i-th voltage value, and I(i) is an i-th current value. V(t) and I(t) are a current voltage value and a current current value, respectively, and V(t−1) and 1(t−1) may be an immediately preceding voltage value and an immediately preceding current value, respectively.

G(i) and H(i) are real values of an i-th G parameter and an i-th H parameter, respectively, and $\hat{G}$(t) and $\hat{H}$(t) are a current value estimate of the G parameter and a current value estimate of the H parameter, respectively.

When the result of differentiating the loss-function ε with respect to $\hat{G}$(t) and $\hat{H}$(t), respectively, the loss-function ε with respect to $\hat{G}$(t) and $\hat{H}$(t) is minimized.

$\hat{G}$(t) in which the result of differentiating the loss-function ε with respect to $\hat{G}$(t) is 0, may be obtained as follows.

$$\frac{\partial \varepsilon}{\partial \hat{G}(t)} = 0$$

$$\sum_{i=1}^{t} \lambda_1^{t-i}(-I(i))\{V(i) - I(i)\hat{G}(t) - H(i)\} = 0$$

Rearranging the above equation, is $\hat{G}$(t) as below.

$$\hat{G}(t) = \frac{\sum_{i=1}^{t} \lambda_1^{t-i}\{V(i) - H(i)\}}{\sum_{i=1}^{t} \lambda_1^{t-i}I(i)^2}$$

$\hat{H}$(t) in which the result of differentiating the loss-function ε with respect to $\hat{H}$(t) is 0, may be obtained as below.

$$\frac{\partial \varepsilon}{\partial \hat{H}(t)} = 0$$

$$\sum_{i=1}^{t} \lambda_2^{t-i}(-1)\{V(i) - I(i)G(i) - \hat{H}(t)\} = 0$$

Rearranging the above equation, is as below.

$$\hat{H}(t) = \frac{\sum_{i=1}^{t} \lambda_2^{t-i}\{V(i) - I(i)G(i)\}}{\sum_{i=1}^{t} \lambda_2^{t-i}}$$

For real-time estimation, $\hat{G}$(t) and $\hat{H}$(t) obtained above are summarized in a recursive form using the state vector $\hat{\Theta}$(t) as follows.

$$\hat{\Theta}(t) = \begin{bmatrix} \hat{G}(t) \\ \hat{H}(t) \end{bmatrix} = \hat{\Theta}(t-1) + L(t) \times (V(t) - I(t)\hat{G}(t-1) - \hat{H}(t-1))$$

Because the current voltage estimate $\hat{V}$(t) is defined as $\hat{V}$(t)=I(t)$\hat{G}$(t−1)+$\hat{H}$(t−1) and the voltage error e(t) is defined as e(t)=V(t)−$\hat{V}$(t), the state vector $\hat{\Theta}$(t) may be expressed as below, as described above.

$$\hat{\Theta}(t) = \begin{bmatrix} \hat{G}(t) \\ \hat{H}(t) \end{bmatrix} = \hat{\Theta}(t-1) + L(t) \times e(t)$$

Here, the gain matrix L(t) and the covariance matrix P(t) may be calculated as below, as respectively described above.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)^2/\lambda_1 \\ P_2(t-1)/\lambda_2 \end{bmatrix}$$

-continued $$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Because the method for detecting an abnormal battery cell according to the present embodiment uses a recursive method, the storage unit 150 may store the current voltage value V(t), the current current value I(t), the state vector $\hat{\Theta}(t)$, and the covariance matrix P(t). According to another embodiment, the storage unit 150 may further store the first forgetting factor $\lambda_1$ and the second forgetting factor $\lambda_2$. The storage unit 150 does not need to store all of past voltage values and past current values.

Because the method for detecting an abnormal battery cell shown in FIG. 2 uses the recursive method, calculation is very simple, and the calculation may be performed by using the storage unit 150 having a small size of several kB. Furthermore, because the state vector $\hat{\Theta}(t)$ and the covariance matrix P(t) are newly updated whenever the voltage value and the current value are received, the voltage and current variations of each of the battery cells 111 may be reflected in the G parameter $\hat{G}(t)$ and the H parameter $\hat{H}(t)$ in substantially real time.

The microprocessor 140 may repeatedly perform Operations S120 to S170 for each time period Δt at which the voltage value V(t) and the current value I(t) of each of the battery cells 111 are measured. Thus, when an abnormal deteriorated cell and an abnormally reduced capacity cell among the battery cells 111 occur, the microprocessor 140 may detect it in real time.

According to the embodiment of FIG. 3, the G parameter $\hat{G}(t)$ and the H parameter $\hat{H}(t)$ may not be updated for each time period Δt.

As described above, the microprocessor 140 may determine whether a current difference ΔI is included in a certain range, by comparing the current difference ΔI with the certain range in which the current difference ΔI is defined as the lower limit value ΔImin and the upper limit value ΔImax (S113). The lower limit value ΔImin and the upper limit value ΔImax may be set according to the charge/discharge current pattern of the battery system 100. The lower limit value ΔImin and the upper limit value ΔImax may be set based on the charge/discharge rate of the battery system 100. For example, the lower limit value ΔImin may be set to 0.2 C, and the upper limit value ΔImax may be set to 1 C.

When the current difference ΔI is too small or too large, a sensing error between the voltage value and the current value causes a large deviation in the G parameter $\hat{G}(t)$ and the H parameter $\hat{H}(t)$ due to the recursive method. When the current value ΔI is included in the certain range, the method may proceed to Operation S121 so that the state vector $\hat{\Theta}(t)$ and the covariance matrix P(t) may be updated based on the current voltage value V(t) and the current current value I(t). However, when the current difference ΔI exceeds the certain range, the method may proceed to Operation S111 so that the state vector $\hat{\Theta}(t)$ and the covariance matrix P(t) may not be updated. That is, when the current difference ΔI exceeds the certain range, the current voltage value V(t) and the current current value I(t) may not affect the state vector $\hat{\Theta}(t)$ and the covariance matrix P(t).

Only when the current difference ΔI is included in the certain range, the G parameter $\hat{G}(t)$ and the H parameter $\hat{H}(t)$ may be updated so that the reliability of the G parameter $\hat{G}(t)$ and the H parameter $\hat{H}(t)$ may be maintained high.

The results of measuring or estimating parameters of a normal battery cell, an abnormally deteriorated cell, and an abnormally reduced capacity cell will be described below with reference to FIGS. 4 through 6.

Figure 4:
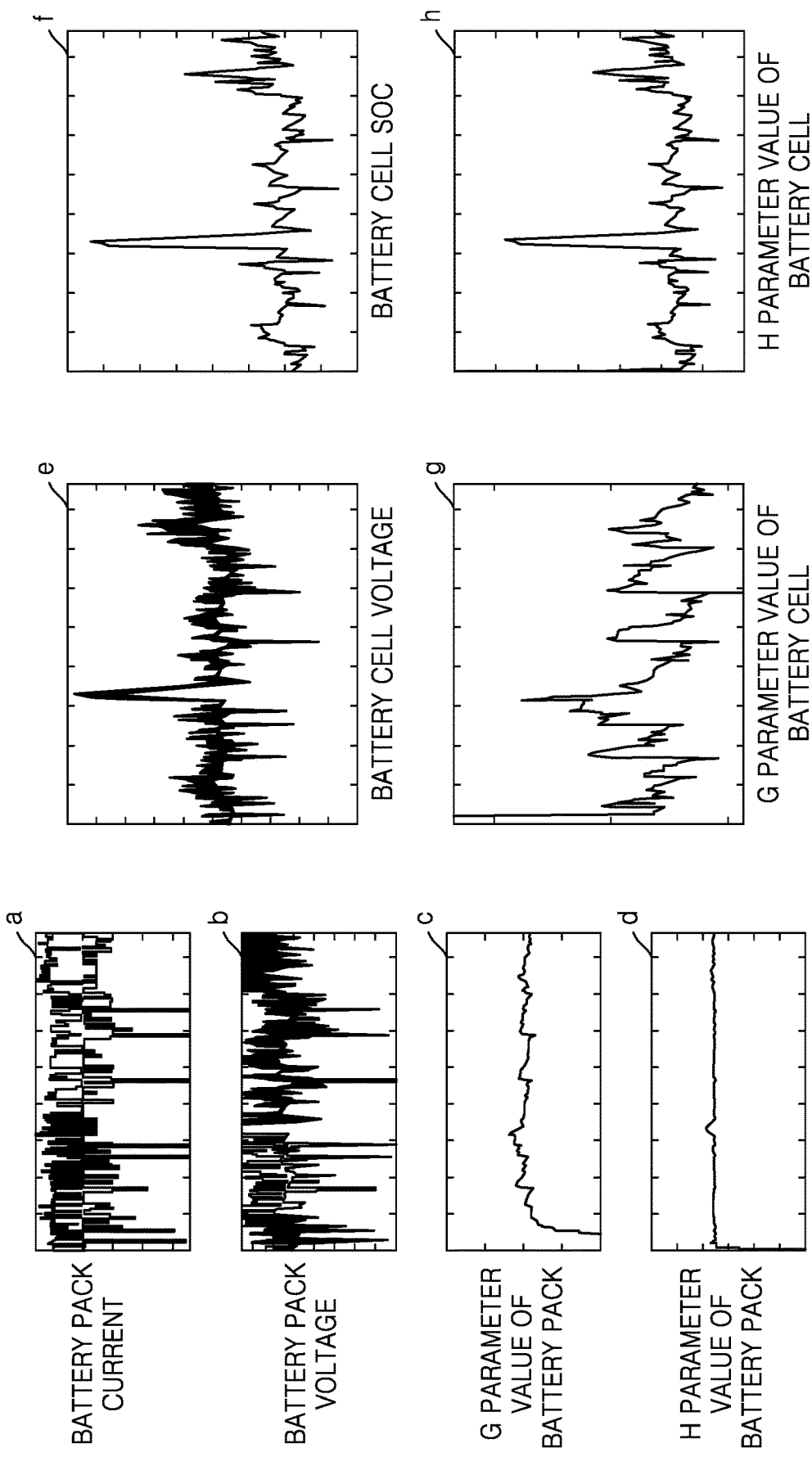
FIG. 4 is graphs illustrating parameters of a battery pack including normal battery cells.

FIG. 4 shows a battery pack current a and a battery pack voltage b measured in a battery pack including normal battery cells, and a G parameter value c and an H parameter value d estimated for the battery pack on the left, and a battery cell voltage e and a battery cell SOC(f) measured in each of normal battery cells included in the battery pack, a G parameter value g and an H parameter value h estimated for the battery cell on the right.

Graphs a-h of FIG. 4 are using current/voltage actually-used operation pattern data of an energy storage system (ESS) of 20 Ah. A structure in which four battery cells are connected in series, was used, and a time period Δt was 1 second. The current flowing through the normal battery cell is the same as the current of the battery pack. Graphs a-h of FIG. 4 show changes in specific parameter values according to time (seconds).

Figure 5:
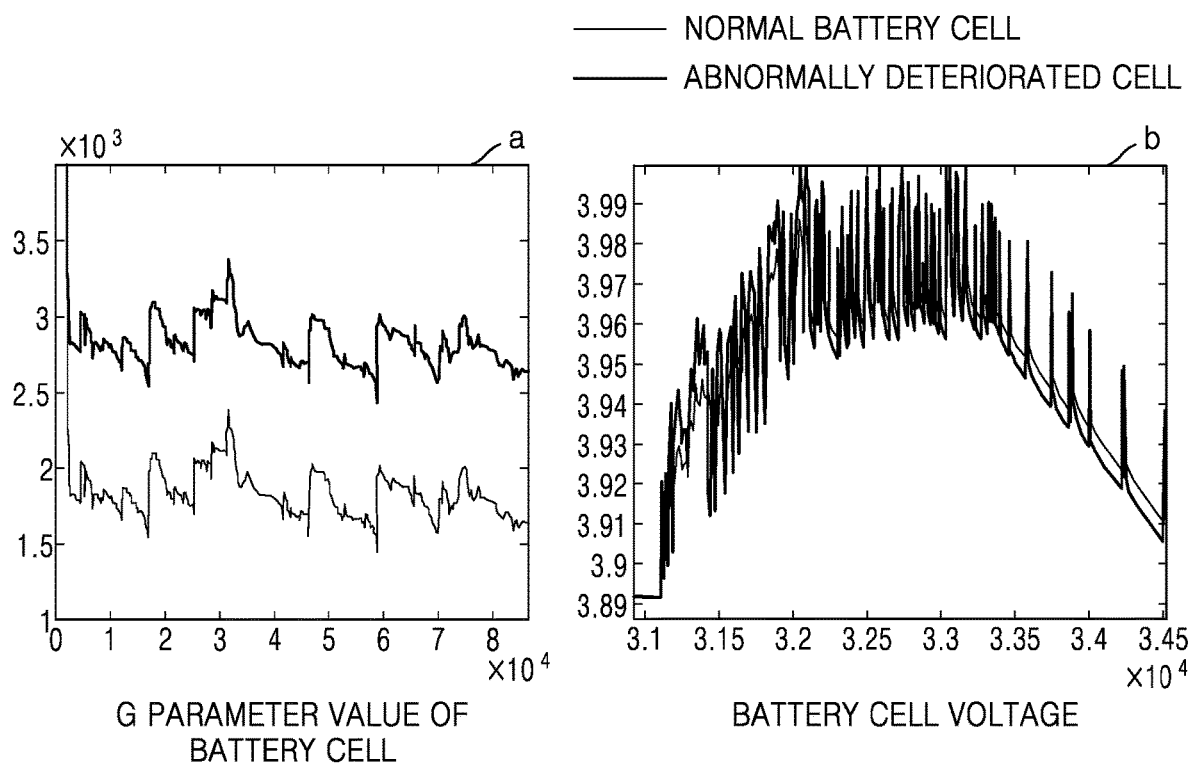
FIG. 5 is graphs for comparing parameters of a normal battery cell and an abnormally deteriorated battery cell so as to verify a method according to an embodiment.

FIG. 5 shows the result of measuring or estimating one normal battery cell after it is replaced with an abnormally deteriorated cell in the battery pack of FIG. 4. Graph a of FIG. 5 shows G parameter values of the normal battery cell and the abnormally deteriorated cell, and graph b of FIG. 5 shows a battery cell voltage of the normal battery cell and the abnormally deteriorated cell.

Normal battery cells and abnormally deteriorated cells cannot be distinguished by the battery cell voltage of graph b, but normal battery cells and abnormally deteriorated cells are clearly distinguished by using the G parameter value of graph a. It can be seen that the G parameter value of the abnormally deteriorated cell is greater than the G parameter value of the normal battery cell. This, according to embodiments of the present disclosure, a G parameter value of a specific battery cell is compared with G parameter values of other battery cells so that it can be clearly seen that the specific battery cell is an abnormally deteriorated cell.

When the battery cell is deteriorated, an internal resistance of the battery cell increases. Because the G parameter represents the sensitivity of voltage with respect to change in current of the battery cell, the internal resistance of the battery cell may be directly reflected. Thus, the method of determining an abnormally deteriorated cell based on the G parameter value may have reliability.

Figure 6:
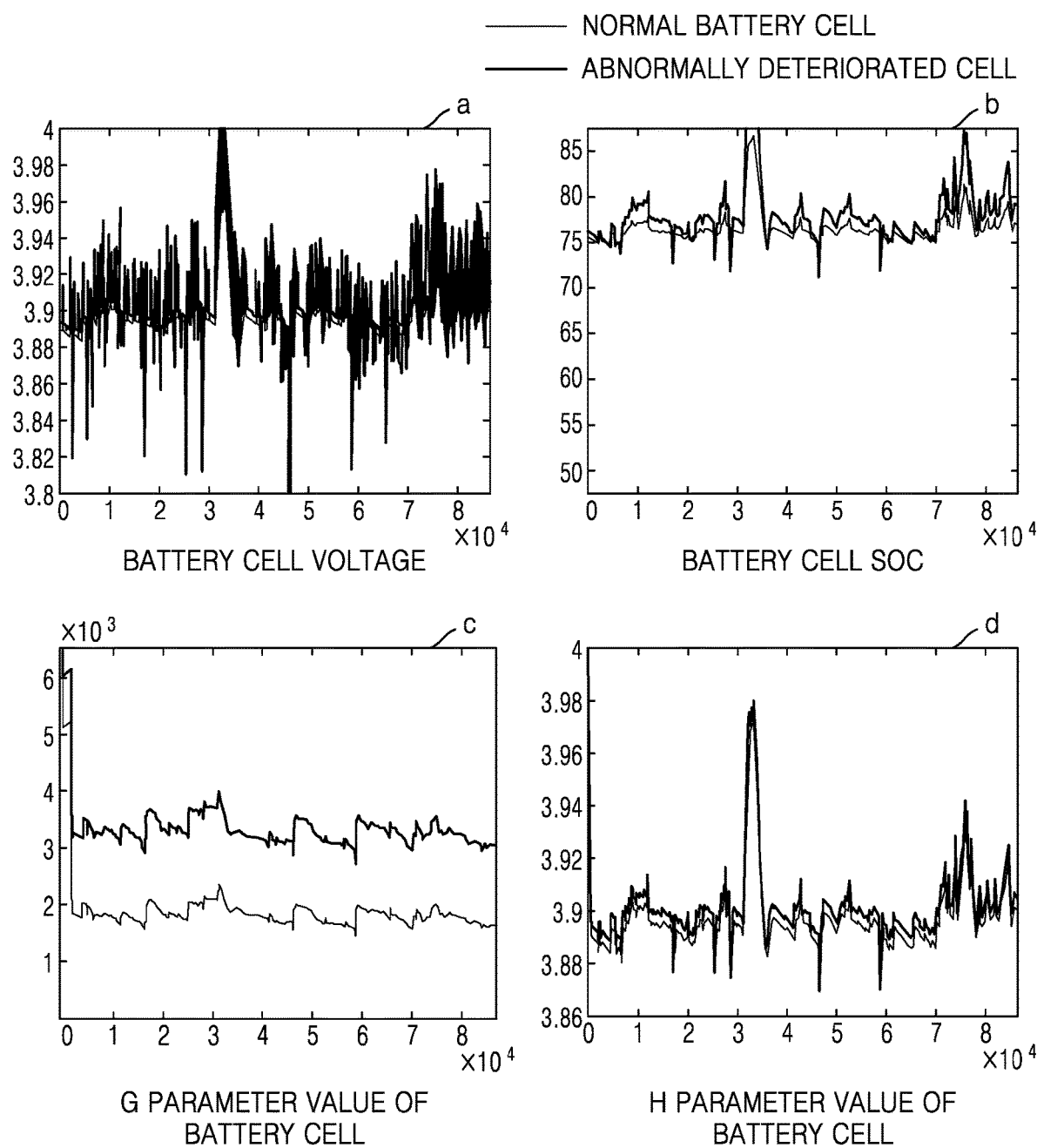
FIG. 6 is graphs for comparing parameters of a normal battery cell and an abnormally reduced capacity battery cell so as to verify a method according to an embodiment.

FIG. 6 shows the result of measuring or estimating one normal battery cell after it is replaced with an abnormally reduced capacity cell in the battery pack of FIG. 4. Graph a of FIG. 6 shows battery cell voltages of the normal battery cell and the abnormally reduced capacity cell, and graph b of FIG. 6 shows a battery cell SOC of the normal battery cell and the abnormally reduced capacity cell, graph c of FIG. 6 shows G parameter values of the normal battery cell and the abnormally reduced capacity cell, and graph d of FIG. 6 shows H parameter values of the normal battery cell and the abnormally reduced capacity cell.

Referring to graphs c and d, it can be seen that not only the G parameter value of the abnormally reduced capacity cell is greater than that of the normal battery cell, but also the H parameter value of the abnormally reduced capacity cell is greater than that of the normal battery cell. Thus, according to embodiments of the present disclosure, a G parameter value and an H parameter value of a specific battery cell are compared with G parameter values and H parameter values of other battery cells, respectively, so that it may be clearly seen whether the specific battery cell is an abnormally reduced capacity cell.

The spirit of the present disclosure is not limited to the above-described embodiments and should not be defined, and the claims to be described later and all ranges equivalent to or changed from these claims fall within the scope of the present disclosure.

The invention claimed is:

1. A method for detecting an abnormal battery cell, the method comprising:
  detecting a voltage and a current of each of a plurality of battery cells electrically connected between first and second terminals and being in use so as to periodically generate a voltage value and a current value for each of the plurality of battery cells;
  updating, by a processor in real time by using an adaptive filter, a plurality of G parameter values for a G parameter and a plurality of H parameter values for an H parameter, by retrieving from a memory of the processor the voltage value and the current value of a corresponding battery cell, wherein each of the plurality of G parameter values and each of the plurality of H parameter values indicate a current state of a corresponding battery cell of the plurality of battery cells, of based on the voltage value and the current value of the corresponding battery cell;
  calculating, by the processor, a representative G parameter value for the plurality of battery cells and calculating a representative H parameter value for the plurality of battery cells; and
  identifying, by the processor, an abnormally deteriorated cell from the plurality of battery cells by retrieving from the memory of the processor a corresponding G parameter value of the plurality of G parameter values, a corresponding H parameter value of the plurality of H parameter values, the representative G parameter value, and the representative H parameter value, and determining, by the processor, a deviation of the corresponding G parameter value from the representative G parameter value, and a deviation of the corresponding H parameter value from the representative H parameter value, wherein
  the G parameter is a parameter indicating sensitivity of voltage with respect to a change in a current of the corresponding battery cell, and
  the H parameter is a parameter indicating an effective potential determined by a local equilibrium distribution and a resistance distribution in the corresponding battery cell.

2. The method of claim 1, wherein the determining of whether each of the battery cells is an abnormally deteriorated cell comprises:
  selecting a first battery cell that is one of the battery cells;
  calculating a G parameter deviation value of the first battery cell by subtracting the representative G parameter value from the G parameter value of the first battery cell;
  calculating an H parameter deviation value of the first battery cell by subtracting the representative H parameter value from the H parameter value of the first battery cell; and
  when the G parameter deviation value of the first battery cell is greater than a preset G parameter set value or the H parameter deviation value of the first battery cell is greater than a preset H parameter set value, determining that the first battery cell is an abnormally deteriorated cell.

3. The method of claim 2, wherein the determining of whether each of the battery cells is an abnormally deteriorated cell comprises when the G parameter deviation value of the first battery cell is greater than the G parameter set value and the H parameter deviation value of the first battery cell is greater than the H parameter set value, determining that the first battery cell is an abnormally reduced capacity cell.

4. The method of claim 1, wherein the representative G parameter value is an average value of G parameter values of the battery cells, and the representative H parameter value is an average value of H parameter values of the battery cells.

5. The method of claim 1, wherein the representative G parameter value is a median value of the G parameter values of the battery cells, and the representative H parameter value is a median value of the H parameter values of the battery cells.

6. The method of claim 1, wherein the adaptive filter is a filter using a recursive least squares (RLS) method.

7. The method of claim 6, further comprising
  initializing a plurality of state vectors and a plurality of covariance matrices each corresponding to the battery cells, wherein
  each of the plurality of state vectors includes the G parameter value and the H parameter value of a corresponding battery cell among the battery cells.

8. The method of claim 7, wherein the periodically generating of the voltage value and the current value for each of the battery cells comprises:
  selecting a first battery cell that is one of the battery cells;
  generating an immediately preceding voltage value and an immediately preceding current value of the first battery cell; and
  generating a current voltage value and a current current value of the first battery cell after a preset time period.

9. The method of claim 8, further comprising:
  calculating a current difference of the first battery cell between the current current value of the first battery cell and the immediately preceding value of the first battery cell; and
  comparing the current difference of the first battery cell with a preset range, wherein
  only when the current difference of the first battery cell is included in the preset range, updating the G parameter value and the H parameter value of the first battery cell by using the current voltage value and the current current value of the first battery cell.

10. The method of claim 8, wherein
  the updating the G parameter value and the H parameter value of each of the battery cells in real time comprises:
  calculating a current voltage estimate of the first battery cell based on the current current value of the first battery cell and the immediately preceding value of the state vector corresponding to the first battery cell;
  updating a gain matrix corresponding to the first battery cell and the covariance matrix corresponding to the first battery cell based on the current current value of the first battery cell and the immediately preceding value of the covariance matrix corresponding to the first battery cell;
  calculating a voltage error of the first battery cell between the current voltage value of the first battery cell and the current voltage estimate of the first battery cell; and
  updating the state vector corresponding to the first battery cell based on the immediately preceding value of the state vector corresponding to the first battery cell, the current value of the gain matrix corresponding to the first battery cell, and the voltage error of the first battery cell, so as to generate a current value of the G parameter of the first battery cell and a current value of the H parameter of the first battery cell.

11. The method of claim 10, wherein the current voltage estimate of the first battery cell is calculated as a value obtained by adding the immediately preceding value of the H parameter of the first battery cell to a product of the current current value of the first battery cell of the immediately preceding value of the G parameter of the first battery cell.

12. The method of claim 10, wherein the current value of the state vector corresponding to the first battery cell is obtained as a value obtained by adding a product of the current value of the gain matrix corresponding to the first battery cell and the voltage error of the first battery cell to the immediately preceding value of the state vector corresponding to the first battery cell.

13. The method of claim 10, wherein, when the gain matrix corresponding to the first battery cell and the covariance matrix corresponding to the first battery cell are updated, a first forgetting factor for the G parameter of the first battery cell and a second forgetting factor for the H parameter of the first battery cell are applied.

14. The method of claim 13, wherein
the gain matrix corresponding to the first battery cell is calculated by the following equation $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix},$$

the covariance matrix corresponding to the first battery cell is calculated by the following equation $$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix},$$

where L(t) is a current value of the gain matrix corresponding to the first battery cell, L(t−1) is an immediately preceding value of the gain matrix corresponding to the first battery cell, P(t) is a current value of the covariance matrix corresponding to the first battery cell, P(t−1) is an immediately preceding value of the covariance matrix corresponding to the first battery cell, P(t−1) is an immediately preceding value of the covariance matrix corresponding to the first battery cell, I(t) is an instant current value of the first battery cell, λ1 is the first forgetting factor, and λ2 is the second forgetting factor.

* * * * *